(12) United States Patent
Tichauer

(10) Patent No.: US 6,362,690 B1
(45) Date of Patent: Mar. 26, 2002

(54) SYSTEM AND METHOD FOR CLOSED LOOP VSWR CORRECTION AND TUNING IN RF POWER AMPLIFIERS

(75) Inventor: Larry M. Tichauer, La Palma, CA (US)

(73) Assignee: Ophir RF, Inc., Los Angeles, CA (US)

( * ) Notice: Subject to any disclaimer, the term of this patent is extended or adjusted under 35 U.S.C. 154(b) by 0 days.

(21) Appl. No.: 09/552,284

(22) Filed: Apr. 19, 2000

(51) Int. Cl.$^7$ ................................................. H02H 7/20
(52) U.S. Cl. ....................... 330/298; 330/127; 330/284; 455/115; 455/126
(58) Field of Search .......................... 330/127, 207 P, 330/296, 297, 298, 284, 144, 145; 455/115, 117, 126

(56) References Cited

U.S. PATENT DOCUMENTS

| | | | |
|---|---|---|---|
| 3,458,826 A | * 7/1969 | Lalande et al. .................. 330/2 |
| 3,852,669 A | * 12/1974 | Bowman et al. ............. 325/151 |
| 4,370,622 A | * 1/1983 | Hornbeck et al. ........ 330/207 P |
| 4,422,047 A | 12/1983 | Wright | |
| 4,547,746 A | * 10/1985 | Erickson et al. ............. 330/298 |
| 4,549,147 A | * 10/1985 | Kondo ......................... 330/297 |
| 4,647,871 A | 3/1987 | Turner, Jr. | |
| 4,704,573 A | 11/1987 | Turner, Jr. | |
| 4,727,337 A | 2/1988 | Jason | |
| 5,196,808 A | * 3/1993 | Pickett et al. ................ 330/298 |
| 5,216,379 A | * 6/1993 | Hamley ........................ 330/134 |
| 5,423,082 A | 6/1995 | Cygan et al. | |
| 5,542,096 A | 7/1996 | Cygan et al. | |
| 5,564,086 A | 10/1996 | Cygan et al. | |
| 5,564,087 A | 10/1996 | Cygan et al. | |
| 5,610,554 A | * 3/1997 | Anvari ........................... 330/52 |
| 5,675,286 A | 10/1997 | Baker et al. | |
| 5,778,308 A | 7/1998 | Sroka et al. | |
| 5,862,458 A | 1/1999 | Ishii | |
| 5,913,154 A | 6/1999 | Wynn | |
| 5,977,831 A | * 11/1999 | Davis et al. ................. 330/279 |
| 6,020,787 A | 2/2000 | Kim et al. | |

* cited by examiner

Primary Examiner—Robert Pascal
Assistant Examiner—Henry Choe
(74) Attorney, Agent, or Firm—Blakely, Sokoloff, Taylor & Zafman LLP

(57) ABSTRACT

A system and method is provided to compensate an amplifier circuit for changes in a load impedance in order to maintain a substantially optimum performance for the amplifier. More specifically, if the load impedance increases, then the amplifier is reconfigured to produce an output impedance that is likewise increased. One way of reconfiguring the amplifier for a load impedance increase is to increase the supply voltage to the device. The increase in the supply voltage to the device increases the rail to rail operation of the device. This would allow more dynamic range for the system performance. Assuming the current is substantially constant, the impedance seen the output of the amplifier will increase and be multiplied up to the impedance desired by the load resulting in a more optimum power transfer. Other parameters, such as the input drive and bias voltage to the amplifier can be changed in order to improve the performance of the amplifier.

6 Claims, 3 Drawing Sheets

SYSTEM AND METHOD FOR CLOSED LOOP VSWR CORRECTION AND TUNING IN RF POWER AMPLIFIERS

FIELD OF THE INVENTION

This invention generally relates to radio frequency (RF)/microwave amplifiers, and in particular, a system and method for automatically improving the impedance match between a load and the output impedance of an output power stage.

BACKGROUND OF THE INVENTION

When an RF power amplifier is designed, the load variations are taken into account when determining the quiescent biasing condition, or "Q" point, for the device. Depending on how poor the match can be with a given load, the resultant "Q" point ends up being compromised. When the condition exists that the magnitude of the load is less than the optimal or characteristic impedance expected by the amplifier, power transfer is no longer optimum.

To achieve the same output power at the load, in the mismatched condition, much more power is dissipated across the output stage. This increase in the power dissipated causes excess heat to be generated in the amplifier which results in an elevated device junction temperature. The elevated junction temperature has an exponential relationship with reliability. In addition to reliability degradation, more power must be supplied to the amplifier than would be required for a properly matched condition. For portable applications which rely heavily on battery capacity, this can drastically increase the time required between recharges.

FIG. 1 illustrates a block diagram of a prior art amplifier output circuit 100. The amplifier output circuit 100 consists of a field effect transistor (FET) 102 having a grounded source (S), and a high RF impedance bias network 104 which directs the power to the output stage. The inherent output impedance for power device 102 is usually much less than the impedance of the load 108. Therefore, for optimum performance, the impedance seen to the left of aa' is transformed to substantially match the impedance at the load 108. Typically, an impedance matching network 106 is employed to multiply up the output impedance of the transistor 102.

The actual impedance of the transistor 102 is calculated by dividing the voltage drop across the transistor by the current flowing from drain (D) to source (S) at the quiescent bias point with no RF input. This would equate basically to the supply voltage divided by the supplied current to the stage in question. This is true for class A operation.

If the load impedance were to change for some reason, a mismatched condition would exist. This would decrease the efficiency of the system since the criteria for optimum power transfer has been violated. The following discusses the effects of the mismatched conditions when the load impedance increases and decreases.

If the load impedance increases, then the transistor's output impedance seen at aa' will be too low for a matched condition. The ac current flowing through the transistor 102, about the "Q" point current will decrease. The ac voltage, seen at the output, will increase across the load constant. This can only occur until the device starts to approach rail to rail operation. At this point, distortion begins to evidence itself and even though the power may start to approach the desired output power level, the spectral density of this power may become very undesirable since the energy is no longer confined to the desired signal but to intermodulation products as well.

If the load impedance decreases, then the transistor's output impedance seen at aa' will be too high for a matched condition. The ac current flowing through the transistor 102, about the "Q" point current, will increase. The ac voltage, seen at the output, wants to decrease. This can continue only until the device starts to saturate in its ability to provide increased current. At this point, distortion begins to evidence itself and, even though the power may start to approach the desired output power, the spectral density of this power may become very undesirable since the energy is no longer confined to the desired signal but to intermodulation products as well. In addition, there will be an increased voltage drop across as well as current through the output transistor 102. This will cause an increase in junction temperature which will lead to increased stress on the transistor 102 as well as performance degradation.

Accordingly, there is a need to mitigate some of the problems stated above.

SUMMARY OF THE INVENTION

One aspect of the invention is a method to compensate an amplifier circuit for changes in a load impedance in order improve the performance of the amplifier. More specifically, if the load impedance increases, then the amplifier is reconfigured to produce an output impedance seen at aa' that likewise increased. One way of reconfiguring the amplifier for a load impedance increase is to increase the drain (FET) or collector (bipolar) voltage to the device. The increase in the drain (FET) or collector (bipolar) voltage to the device increases the rail to rail operation capability of the device. This would allow more dynamic range for the system performance. Assuming the drain (FET) or collector (bipolar) current is substantially constant, the impedance seen at aa' will increase and be multiplied up, by the impedance matching network, to the impedance desired by the load resulting in more optimum power transfer.

Similarly, if the load impedance decreases, then the amplifier is reconfigured to produce an output impedance seen at aa' that likewise decreases. One way of reconfiguring the amplifier for a load impedance decrease is to decrease the drain (FET) or collector (bipolar) voltage to the device. Assuming the drain (FET) or collector (bipolar) current is substantially constant, the impedance seen at aa' will decrease and be multiplied up, by the impedance matching network, to an impedance closer to that desired by the load for a more optimum power transfer.

In addition to changing the supply voltage to the amplifier for tuning its output circuit with the load, the drive input and the gate voltage (FET) or base current (bipolar) to the amplifier can also be changed to improve the impedance match between the output of the amplifier and the load. Specifically, if the load impedance increases, then the input drive to the amplifier is increased, and if the load impedance decreases, the input drive to the amplifier is decreased. Also, if the load impedance increases, the gate voltage (FET) or base current (bipolar) to the amplifier is changed to decrease the conduction current through the device, and if the load impedance decreases, the gate voltage (FET) or base current (bipolar) to the amplifier is changed to increase the conducting current through the device.

Other aspects of the invention includes an amplifier comprising an output amplification stage, a directional coupler for generating signals indicative of forward and reverse powers between the output amplification stage and a load, and a controller for determining an impedance match between the output amplification stage and the load from the signals indicative of forward and reverse powers. The controller is capable of changing an input drive to the output amplification stage in response to a change in an impedance of the load to improve the impedance match between the output amplification stage and the load. The controller can also change the drain and/or gate voltages (FET), or collector voltage and/or base current (bipolar) to the amplifier along with the input drive, individually or in any combination, to improve the impedance match between the output amplification stage and the load.

An additional aspect of the invention includes a method of tuning an amplifier, comprising the steps of changing an input drive to the amplifier along with the drain and/or gate voltages (FET), or collector voltage and/or base current (bipolar) to the amplifier, individually or in any combination, to improve the performance of the amplifier. The tuning of the amplifier by changing the variables listed above may be in response to a change in the load impedance. In such a case, it may be desirable to determine the impedance match between the output of the amplifier and the load.

Still, yet another aspect of the invention includes an amplifier comprising a plurality of cascaded amplification stages including an output amplification stage, a directional coupler for generating signals indicative of forward and reverse powers between the output amplification stage and a load, and a controller for determining an impedance match between the output amplification stage and the load from signals indicative of forward and reverse powers, and for changing the operating conditions of respective amplification stages to improve the impedance match between the output amplification stage and the load. The operating conditions of the respective amplification stages changed include the drain (or collector) voltage, input drive and/or the gate voltage (or base current). A directional coupler may be included between each of the stages of an amplifier, or between some of the stages.

Other aspects of the invention will become apparent from the detailed discussion of the invention as provided below.

DETAILED DESCRIPTION OF THE INVENTION

Figure 1:
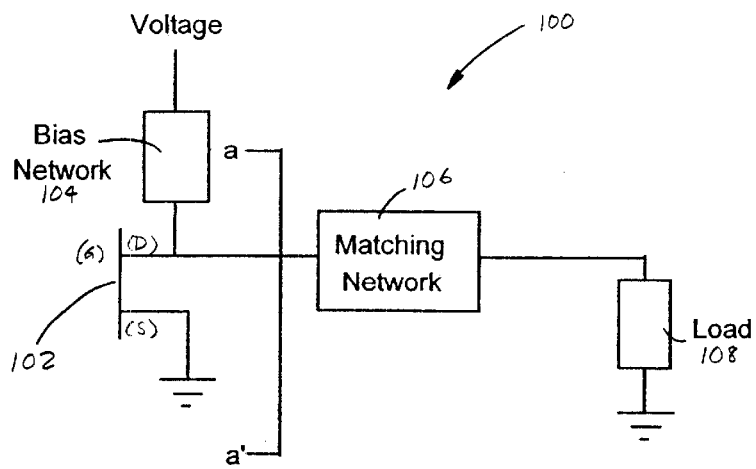
FIG. 1 illustrates a block diagram of a prior art amplifier output circuit.
Figure 2:
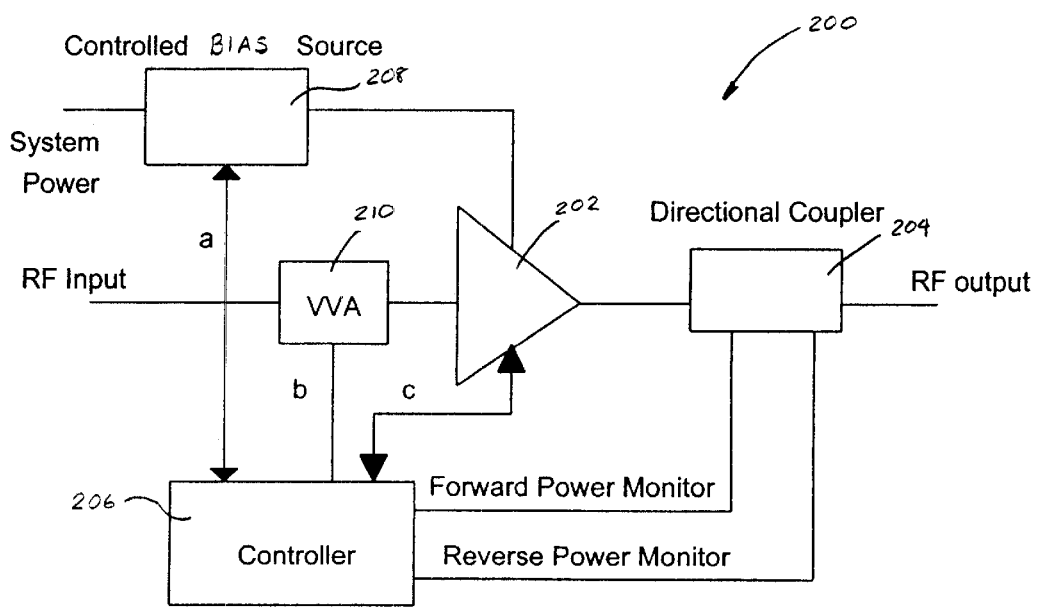
FIG. 2 illustrates a block diagram of an exemplary amplifier with an exemplary circuit for controlling the impedance match between the output of the amplifier and a load, in accordance with the invention.

FIG. 2 illustrates a block diagram of an exemplary amplifier 200 with an exemplary circuit for controlling the impedance match between the output of the amplifier and the load in accordance with the invention. The amplifier 200 comprises an output amplifier stage 202, a directional coupler 204 at the output of the amplifier stage 202, a controller 206, a controlled bias source 208, and a voltage variable amplifier (VVA) 210. The directional coupler 204 provides the controller 206 the forward and reverse power at the output of the amplifier stage 202. The controller 206 can determine the VSWR or quality of the impedance match between the output of the amplifier stage 202 and the load (not shown). The controller 206 monitors the impedance match between the output of the amplifier stage 202 and the load, and reconfigures the amplifier stage 202 to improve its power performance. The load can include passive elements, such as an antenna, an input to a subsequent cascaded amplification stage or an input to another electronic device.

The controller 206 is coupled to the controlled bias source 208 by way of line "a". Through line "a", the controller 206 controls the controlled bias source 208 so that a desired bias configuration is applied to the amplifier stage 202. In the preferred embodiment, the bias configuration to the amplifier stage 202 may be adjusted by relatively small step increments or decrements. Adjusting the bias configuration in steps allows the controller 206 to re-measure the output impedance match between steps, until a more optimum operating condition for the amplifier stage 202 is located. The bias configuration may include drain and/or gate voltage to a field effect transistor (enhanced or depletion mode), or a collector voltage and/or base current to a bipolar transistor. The controller 206 may also use line "a" to monitor the current (e.g. drain or collector current) drawn by the amplifier stage 202. If too much current is drawn in a class AB amplifier stage 202, compensation may become necessary by lowering the current to the amplifier stage 202.

The controlling of the bias of the amplifier need not be limited to bipolar and field effect transistor technology. But, can be applicable to other devices that are developed in the future. In essence, what is being done here is the impedance of the active device is being changed to compensate for changes in the amplifier operating environment, including variations in the load impedance, temperature, and input drive. This operation need not be limited to bipolar or field effect transistor technology, and can encompass other technologies including future developed technologies. Also other devices within the family of bipolar and field effect transistor technology are contemplated, including heterojunction bipolar transistors (HBTs) (bipolar technology) and pseudomorphic high electron mobility transistor (PHEMTs) (field effect transistor technology).

The controller 206 is coupled to the voltage variable amplifier (VVA) 210 by way of line "b". Through line "b", the controller 206 controls the gain or attenuation of the voltage variable amplifier (VVA) 210. The voltage variable amplifier (VVA) 210 is used to change the drive level to the amplifier stage 202. The voltage variable amplifier (VVA) 210 receives an RF input signal at a particular level. By having the controller 206 vary the gain or attenuation of the voltage variable amplifier (VVA) 210, the power level of the RF signal at the input of the amplifier stage 202 can be varied. This can be used to change the "Q" point for the amplifier stage 202 to improve the impedance match between the output of the amplifier stage 202 and the load. This is particularly true for class AB type amplifiers. An attenuator, such as a pin diode attenuator, can also be used in place of the voltage variable amplifier (VVA) 210. Additionally, the VVA can also be used to control the output power and overall gain of the amplifier.

The controller 206 is coupled to the amplifier stage 202 by way of line "c". Through line "c", the controller 206 receives a signal indicative of the temperature of the active device in the amplifier stage 202. The controller 206 uses the device temperature information to reconfigure the amplifier stage 202 to either operate at a more benign operating condition or to shutdown when the device temperature exceeds a predetermined threshold. The benign operating condition or shutdown continues until the device temperature drops to an acceptable level.

In operation, if the load impedance increases, the controller 206 senses the mismatched condition by monitoring the forward and reverse powers received from the directional coupler 204. The controller 206 then instructs the controlled bias source 208 to increase the drain or collector voltage to the amplifier stage 202 in incremental steps. Between adjacent steps, the controller 206 re-determines the impedance matching between the output of the amplifier stage 202 and the load. The controller 206 adjusts the controlled bias source 208 until the drain or collector voltage is reached that results in the desired impedance match between the output of the amplifier stage 202 and the load. The voltage changed can include the drain voltage if a type field effect transistor is used in the amplifier stage 202 or the collector voltage if a type bipolar transistor is used in the amplifier stage 202.

If the load impedance decreases, the controller 206 senses the mismatched condition by monitoring the forward and reverse powers received from the directional coupler 204. The controller 206 then instructs the controlled bias source 208 to decrease the drain or collector voltage to the amplifier stage 202 in decremental steps. Between adjacent steps, the controller 206 re-determines the impedance matching between the output of the amplifier stage 202 and the load. The controller 206 adjusts the controlled bias source 208 until the drain or collector voltage is reached that results in the desired impedance match between the output of the amplifier stage 202 and the load. Again, the bias voltage can include the drain voltage if a field effect transistor is used in the amplifier stage 202 or the collector voltage if a bipolar transistor is used in the amplifier stage 202.

Alternatively, if the load impedance increases, the controller 206 senses the mismatched condition by monitoring the forward and reverse powers received from the directional coupler 204. The controller 206 then increases the gain (or decreases the attenuation) of the voltage variable amplifier (VVA) 210 in incremental steps to raise the drive to the amplifier stage 202. Between adjacent steps, the controller 206 re-determines the impedance matching between the output of the amplifier stage 202 and the load. The controller 206 continues to increase the gain (or decreases the attenuation) of the voltage variable amplifier (VVA) 210 until desired impedance match between the output of the amplifier stage 202 and the load is achieved.

If the load impedance decreases, the controller 206 senses the mismatched condition by monitoring the forward and reverse powers received from the directional coupler 204. The controller 206 then decreases the gain (or increases the attenuation) of the voltage variable amplifier (VVA) 210 in decremental steps to lower the drive to the amplifier stage 202. Between adjacent steps, the controller 206 re-determines the impedance matching between the output of the amplifier stage 202 and the load. The controller 206 continues to decrease the gain (or increase the attenuation) of the voltage variable amplifier (VVA) 210 until the desired impedance match between the output of the amplifier stage 202 and the load is achieved.

In an alternative embodiment, the amplifier stage 202 is configured so that the impedance match between the output of the amplifier and the load is substantially optimum when the input drive to the amplifier stage 202 is relatively low. Then, when the load impedance changes (i.e. either increasing or decreasing), the controller 206 causes the voltage variable amplifier (VVA) 210 to increase in gain (or decrease in attenuation) so that the input drive to the amplifier stage 202 is increased. This action improves the impedance match between the output of the amplifier stage 202 and the load when the load increases.

Also alternatively, if the load impedance increases, the controller 206 senses the mismatched condition by monitoring the forward and reverse powers received from the directional coupler 204. The controller 206 then instructs the controlled bias source 208 to change the gate voltage of a field effect transistor for decreased channel conduction or decrease the base current of a bipolar transistor of the amplifier stage 202 in steps. Between adjacent steps, the controller 206 re-determines the impedance matching between the output of the amplifier stage 202 and the load. The controller 206 continues to instruct the controlled bias source 208 accordingly until the desired impedance match between the output of the amplifier stage 202 and the load is achieved.

If the load impedance decreases, the controller 206 senses the mismatched condition by monitoring the forward and reverse powers received from the directional coupler 204. The controller 206 then instructs the controlled bias source 208 to change the gate voltage of a field effect transistor for increased channel conduction or increase the base current of a bipolar transistor of the amplifier state 202 in steps. Between adjacent steps, the controller 206 re-determines the impedance matching between the output of the amplifier stage 202 and the load. The controller 206 continues to instruct the controlled bias source 208 accordingly until the desired impedance match between the output of the amplifier stage 202 and the load is achieved.

The above three methods (i.e. changing the drain voltage, the drive level, and the gate voltage for field effect transistor amplifiers, or changing the collector voltage, the drive level, and the base current for bipolar amplifiers) of compensating for changes in the load impedance can be performed individually or in any combination.

Figure 3:
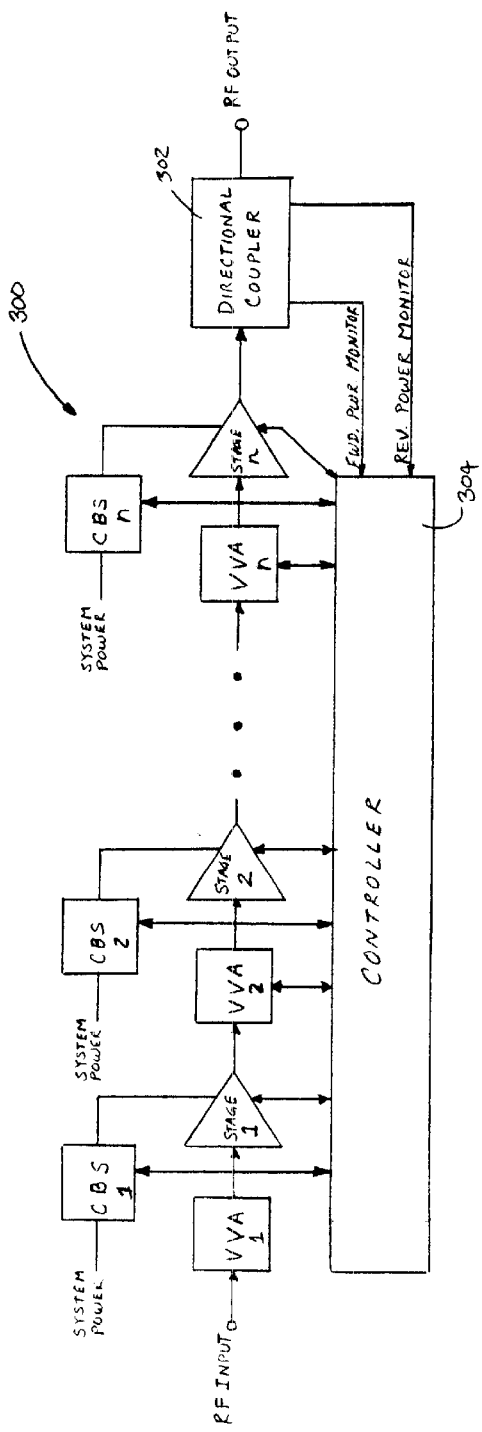
FIG. 3 illustrates a block diagram of an exemplary multiple stage amplifier in accordance with the invention.

FIG. 3 illustrates a block diagram of an exemplary multiple stage amplifier 300 in accordance with the invention. The amplifier 300 comprises two or more amplification stages. In the example shown, the amplifier 300 includes "n" amplification stages. For each amplification stage, the amplifier 300 includes a voltage variable amplifier (VVA) and a controlled bias source (CBS) coupled to the system power. The voltage variable amplifiers (VVA) can vary the drive to respective amplification stages, and the controlled bias sources (CBS) can vary the drain and/or gate voltages for respective field effect transistor amplification stages, or the collector voltage and/or base current for respective bipolar transistor amplification stages. The amplifier 300 further includes a directional coupler 302 at the output of the last stage (i.e. stage "n"). The directional coupler provides the controller 304 the forward and reverse power at the output of the amplifier stage "n". The controller 304 can determine the VSWR or quality of the impedance match between the output of the output stage (i.e. stage "n") and the load (not shown).

The controller 304 monitors the impedance match between the output of the output stage (i.e. stage "n") and the load, and tunes each of the amplification stages (i.e. stages 1 through "n") to achieve the desired impedance matching between output amplification stage (i.e. stage "n") and the load. The controller 304 tunes each of the amplification stages by changing the respective drain voltages (field effect transistors) or collector voltages (bipolar transistors) with the use of the respective controlled bias sources (CBS'), and/or by changing respective drive inputs with the use of respective voltage variable amplifiers (VVAs), and/or by changing respective gate voltages (field effect transistors) or base currents (bipolar transistors), while monitoring the impedance match between the output stage (i.e. stage "n") and the load. Thus, the controller 304 can tune all or some of the stages of the amplifier 300 to achieve the desired performance for the amplifier 300. The amplification stages can be all be implemented with field effect transistors or bipolars, or a mixture of bipolars and field effect transistors.

Figure 4:
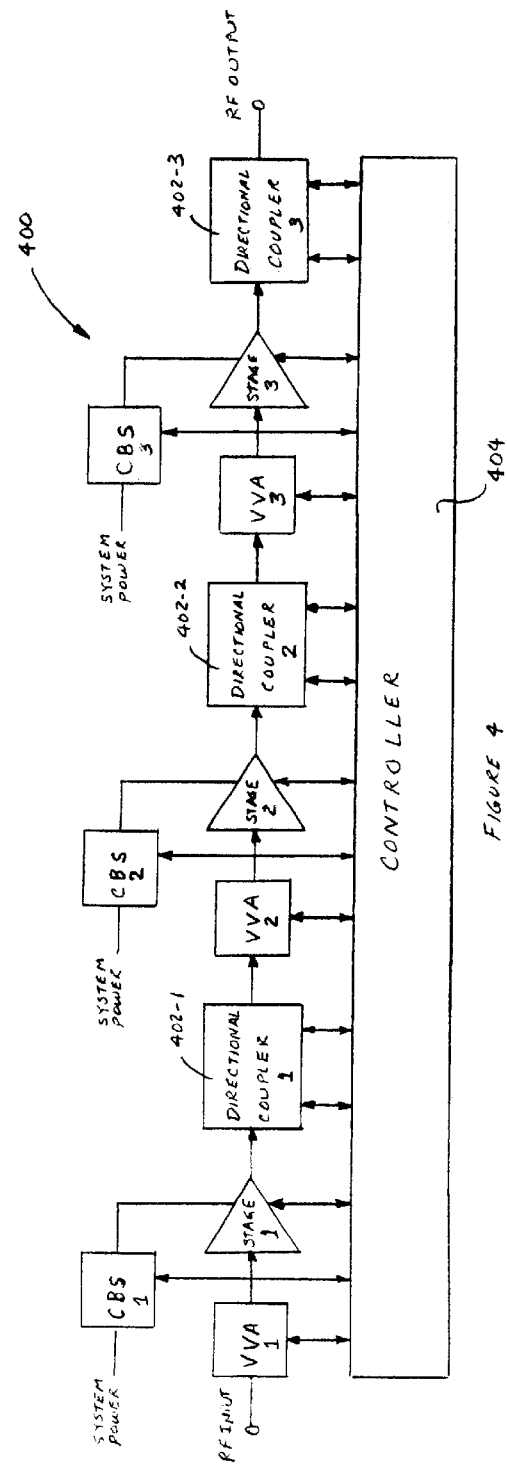
FIG. 4 illustrates a block diagram of yet another exemplary multiple stage amplifier in accordance with the invention.

FIG. 4 illustrates a block diagram of yet another exemplary multiple stage amplifier 400 in accordance with the invention. The multiple stage amplifier 400 is similar to multiple stage amplifier 300 previously discussed, except that a directional coupler (i.e. directional couplers 402-1, 402-2 and 403-3) is at the output of each of the amplification stages in order for a controller 404 to monitor the impedance match between amplification stages. The controller 404 tunes each of the amplification stages by changing the respective drain voltages (field effect transistors) or collector voltages (bipolar transistors) with the use of the respective controlled bias sources (CBS'), and/or by changing respective drive inputs with the use of respective voltage variable amplifiers (VVAs), and/or by changing respective gate voltages (field effect transistors) or base currents (bipolar transistors), while monitoring the impedance matches between stages and between the output stage and the load. Thus, the controller 404 can tune all or some of the stages of the amplifier 400 to achieve the desired performance for the amplifier 400. The amplification stages can be all be implemented with field effect transistors or bipolars, or a mixture of bipolars and field effect transistors. Although in the exemplary multiple stage amplifier 400 includes is a directional coupler between each of the stages, it shall be understood that there need not be a directional coupler between every cascaded stages.

In the exemplary embodiments, the tuning of the amplification stages can be performed in a manner that the operating class of the active device can be changed. For example, if greater output linearity of an amplification stage is desired, its corresponding drain or collector voltage, input drive, and/or gate voltage or bias current may be changed to reconfigure the amplification stage from operating in a class "A" condition to a class "AB" condition, a class "B", or a class "C". More generally, the operating condition of the amplifier can be changed so that the amplifier is reconfigured from operating in a class to operating in another class. In this manner, the amplification stage or amplifier can be re-configured to operate in a more desired manner.

The above exemplary embodiments of the invention have been generally directed at dynamic controlling of the operating conditions of an amplifier to achieve a desired result in the midst of changes in various environment parameters, including load impedance, temperature, and input drive variations. There are other modes of operations, apart from the dynamic control operation, for the above amplifiers. These are factory-set operating condition amplifiers, user-selectable operating condition amplifiers, and pre-programmed operating condition amplifiers.

In factory-set operating condition amplifiers, a computer or other processor-based system is used in a similar manner as controller 206 to determine a desired operating condition for the amplifier given a known set of conditions. More specifically, in the factory, a computer or other processor-based system is used to set a desired operating condition by varying the bias and input drive to the amplifier in accordance with the invention as described above. Once the desired operating condition for the amplifier has been determined, data representing the desired operating condition can be rewritten into a non-volatile memory (e.g. a flash EEPROM) to be accessed by a controller upon powering the amplifier. The controller then uses the data to set the amplifier at the desired operating condition.

In a user selectable operating condition amplifier, the amplifier will be used in several distinct applications where the desired operating condition for the amplifier differs. In a factory setting, a computer or other processor based system is used to set the desired operating condition for each of the applications for the amplifier. Data representing the various operating conditions is written into a non-volatile memory to be accessed by a controller for varying the operating condition of the amplifier. A user can select a desired application for the amplifier by activating a switch or the like, and the controller responds accordingly by accessing the data relating to the corresponding operating condition from the non-volatile memory. The controller then uses the data to set the amplifier at the corresponding operating condition.

In a pre-programmed operating condition amplifier, the desired operating condition for an amplifier may depend on many environment variables, including temperature, load impedance, and input drive, to name a few. In a factory setting, a computer or other processor based system is used to determine the desired operating conditions for respective sets of environment parameters. These various operating conditions and corresponding environment variable sets can be written into a non-volatile memory in a look-up table fashion to be accessed by a controller to set the operating condition of the amplifier. During operation of the amplifier, a controller monitors the environment parameters of the amplifier, and then searches the look-up table in the memory to access the corresponding operating condition for the amplifier. The controller then sets the amplifier to the selected operating condition.

Figure 5:
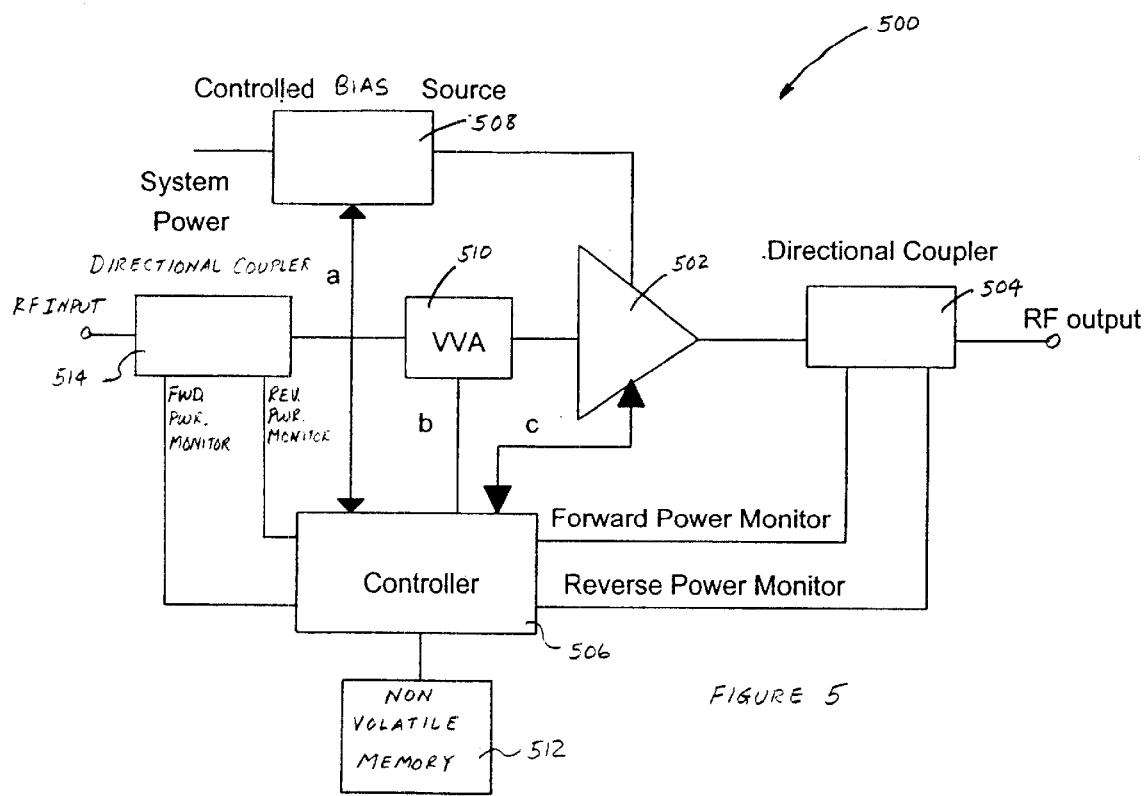
FIG. 5 illustrates a block diagram of an exemplary amplifier that is useful for various modes of operations, including a dynamic control, factory-set, user-selectable, and pre-programmed modes of operations.

FIG. 5 illustrates an exemplary amplifier 500 that is useful for the various mode of operations, including the dynamic control, factory-set, user-selectable, and the pre-programmed amplifiers. Amplifier 500 is similar to amplifier 200 (FIG. 2) in that it comprises an amplification stage 502, an output directional coupler 504, a controller 506, a controlled bias source 508, and a voltage variable amplifier (VVA) 510. The amplifier 500 further includes a non-volatile memory 512 (e.g. a flash EEPROM) for storing data relating to one or more operating condition settings for the amplifier 500. The data may be accessed by the controller 506 for setting the amplification stage 502 to the selected operating condition. The amplifier 500 may also include a directional coupler 514 at its input to allow the controller 506 to determine the input matching.

Amplifier 500 lends itself to mass production since a plurality of this type of amplifiers can be configured into a bank, and the operating conditions for each of the amplifiers can be automatically set and written into the non-volatile memory 512 by a dedicated computer or processor-based system. Amplifier 500 also lends itself to servicing in the field with the use of a portable computer or other processor-based system that can update the operating condition(s) data stored in the non-volatile memory 512.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

It is claimed:

1. A method for compensating an amplifier for changes in a load impedance, comprising:
  automatically determining an impedance match between an output of said amplifier and said changed load impedance;
  changing an input drive to said amplifier to improve said impedance match between said output of said amplifier and said changed load impedance, wherein said changing said input drive to said amplifier comprises:
  modulating said input drive to maintain a substantially constant output power level for said amplifier;
  changing a channel conductance or base current to said amplifier to improve said impedance match between said output of said amplifier and said changed load impedance, wherein said changing said channel conductance or base current comprises decreasing said channel conductance or base current to said amplifier if said load impedance increases, and increasing said channel conductance or base current to said amplifier if said load impedance decreases; and
  changing a drain or collector voltage to said amplifier to improve said impedance match between said output of said amplifier and said changed load impedance, wherein said changing said drain or collector voltage comprises increasing said drain or collector voltage to said amplifier if said load impedance increases, and decreasing said drain or collector voltage to said amplifier if said load impedance decreases.

2. The method of claim 1, further including:
  determining a temperature of an active device of said amplifier; and
  reducing a supply power to said amplifier if said temperature exceeds a predetermined level.

3. The method of claim 2, wherein said reducing said supply power comprises reducing said supply power until substantially no current is drawn by said active device.

4. An amplifier comprising:
  an output amplification stage;
  a directional coupler for generating signals indicative of forward and reverse powers between said output amplification stage and a load; and
  a controller for determining an impedance match between said output amplification stage and said load from said signals indicative of forward and reverse powers, and for changing an input drive to said output amplification stage in response to a change in an impedance of said load to improve said impedance match between said output amplification stage and said load, wherein said controller is capable of:
  modulating said input drive to maintain a substantially constant output power level for said amplifier;
  decreasing a channel conductance or base current to said output amplification stage if said load impedance increases;
  increasing said channel conductance or base current to said output amplification stage if said load impedance decreases;
  increasing a drain or collector voltage to said output amplification stage if said load impedance increases; and
  decreasing said drain or collector voltage to said output amplification stage if said load impedance decreases.

5. The amplifier of claim 4, wherein said controller is capable of:
  determining a temperature of an active device of said amplifier; and
  reducing a supply power to said amplifier if said temperature exceeds a predetermined level.

6. The amplifier of claim 5, wherein said controller is capable of reducing said supply power until substantially no current is drawn by said active device.

* * * * *